(12) United States Patent
Suematsu et al.

(10) Patent No.: US 12,243,869 B2
(45) Date of Patent: Mar. 4, 2025

(54) SEMICONDUCTOR DEVICE AND SEMICONDUCTOR STORAGE DEVICE

(71) Applicant: Kioxia Corporation, Tokyo (JP)

(72) Inventors: Yasuhiro Suematsu, Yokohama (JP); Maya Inagaki, Yokohama (JP)

(73) Assignee: Kioxia Corporation, Tokyo (JP)

( * ) Notice: Subject to any disclaimer, the term of this patent is extended or adjusted under 35 U.S.C. 154(b) by 145 days.

(21) Appl. No.: 17/350,852

(22) Filed: Jun. 17, 2021

(65) Prior Publication Data

US 2022/0285337 A1 Sep. 8, 2022

(30) Foreign Application Priority Data

Mar. 5, 2021 (JP) ................. 2021-035502

(51) Int. Cl.
*H01L 27/02* (2006.01)
*H01L 23/522* (2006.01)
*H01L 29/417* (2006.01)
*H10B 43/27* (2023.01)
*H10B 43/40* (2023.01)

(52) U.S. Cl.
CPC ...... *H01L 27/0255* (2013.01); *H01L 23/5226* (2013.01); *H01L 29/417* (2013.01); *H10B 43/27* (2023.02); *H10B 43/40* (2023.02)

(58) Field of Classification Search
CPC ......... H01L 27/11551; H01L 27/11553; H01L 27/11556; H01L 27/11578; H01L 27/1158; H01L 27/11582; H10B 41/20; H10B 41/23; H10B 41/27; H10B 43/20; H10B 43/23; H10B 43/27
See application file for complete search history.

(56) References Cited

U.S. PATENT DOCUMENTS

| 7,528,449 | B2 | 5/2009 | Sutou et al. |
| 8,143,690 | B2 | 3/2012 | Park et al. |
| 8,399,954 | B2 | 3/2013 | Furuta |
| 9,136,263 | B2 | 9/2015 | Koyama et al. |
| 10,522,228 | B2 | 12/2019 | Tanaka |

(Continued)

FOREIGN PATENT DOCUMENTS

| JP | 2018-157103 A | 10/2018 |
| TW | 200913225 A | 3/2009 |
| TW | 201939709 A | 10/2019 |

*Primary Examiner* — Jesse Y Miyoshi
(74) *Attorney, Agent, or Firm* — Oblon, McClelland, Maier & Neustadt, L.L.P.

(57) ABSTRACT

In one embodiment, a semiconductor device includes substrate, a plurality of electrode layers provided above the substrate, and separated from each other in a first direction perpendicular to a surface of the substrate, and a first plug provided in the plurality of electrode layers. The device further includes first and second diffusion layers provided in the substrate, one of the first and second diffusion layers functioning as an anode layer of an ESD (electrostatic discharge) protection circuit, the other of the first and second diffusion layers functioning as a cathode layer of the ESD protection circuit, a second plug provided at a position that overlaps with the first diffusion layer in planar view, and electrically connected with the first diffusion layer, and a third plug provided at a position that does not overlap with the first diffusion layer in planar view, and electrically connected with the first diffusion layer.

13 Claims, 10 Drawing Sheets

(56) References Cited

U.S. PATENT DOCUMENTS

| | | | |
|---|---|---|---|
| 11,018,128 B2 | 5/2021 | Kutsukake | |
| 2011/0204447 A1* | 8/2011 | Wang | H01L 27/0262 |
| | | | 257/360 |
| 2019/0198524 A1* | 6/2019 | Fujiki | H01L 21/76897 |
| 2019/0279996 A1* | 9/2019 | Yamashita | H01L 27/0688 |
| 2020/0203329 A1 | 6/2020 | Kanamori et al. | |
| 2021/0343342 A1* | 11/2021 | Lee | H01L 27/11556 |

* cited by examiner

SEMICONDUCTOR DEVICE AND SEMICONDUCTOR STORAGE DEVICE

CROSS REFERENCE TO RELATED APPLICATION

This application is based upon and claims the benefit of priority from the prior Japanese Patent Application No. 2021-035502, filed on Mar. 5, 2021, the entire contents of which are incorporated herein by reference.

FIELD

Embodiments described herein relate to a semiconductor device and a semiconductor storage device.

BACKGROUND

When the layout of an electrostatic discharge (ESD) protection circuit in a semiconductor device is designed, it is desirable, for example, to employ a suitable layout that allows reduction in surge path resistance and pin capacity.

DETAILED DESCRIPTION

Figure 1:
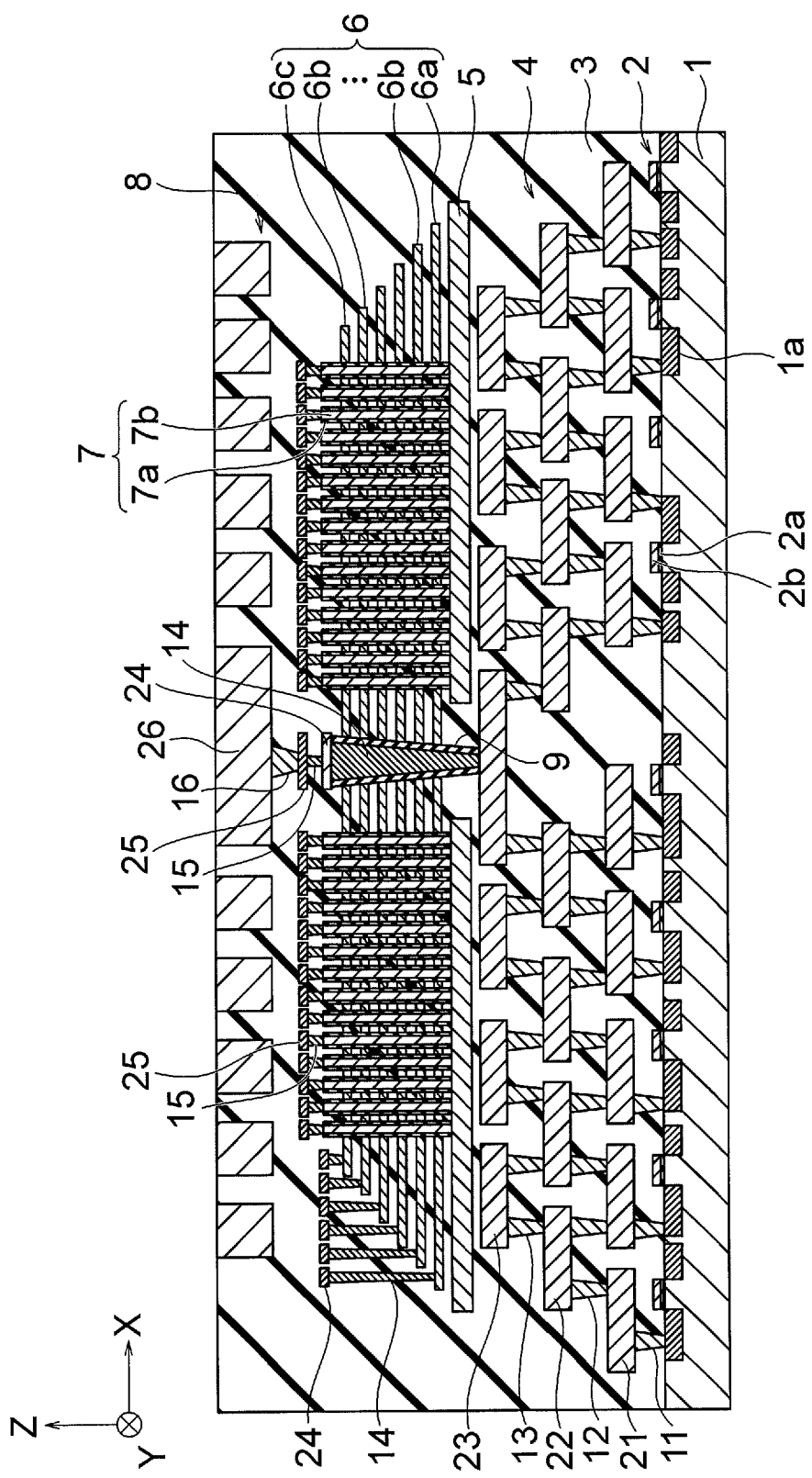
FIG. 1 is a sectional view showing a structure of a semiconductor device in a first embodiment.

Embodiments will now be explained with reference to the accompanying drawings. In FIGS. 1 to 10, identical constituents are denoted by identical reference characters, and repetitive descriptions are omitted.

In one embodiment, a semiconductor device includes substrate, a plurality of electrode layers provided above the substrate, and separated from each other in a first direction perpendicular to a surface of the substrate, and a first plug provided in the plurality of electrode layers. The device further includes first and second diffusion layers provided in the substrate, one of the first and second diffusion layers functioning as an anode layer of an ESD (electrostatic discharge) protection circuit, the other of the first and second diffusion layers functioning as a cathode layer of the ESD protection circuit, a second plug provided at a position that overlaps with the first diffusion layer in planar view, and electrically connected with the first diffusion layer, and a third plug provided at a position that does not overlap with the first diffusion layer in planar view, and electrically connected with the first diffusion layer.

First Embodiment

FIG. 1 is a sectional view showing a structure of a semiconductor device in a first embodiment.

The semiconductor device in FIG. 1 includes a substrate 1, a plurality of transistors 2, an inter layer dielectric 3, a multi-layer interconnect portion 4, a source layer 5, a plurality of electrode layers 6, a plurality of columnar portions 7, a multi-layer interconnect portion 8 and an insulator 9. For example, the semiconductor device in FIG. 1 includes a three-dimensional memory.

For example, the substrate 1 is a semiconductor substrate such as a silicon substrate. FIG. 1 shows an X-direction and a Y-direction parallel to a surface of the substrate 1 and perpendicular to each other, and a Z-direction perpendicular to the surface of the substrate 1. In the specification, a +Z-direction is regarded as an upward direction, and a −Z-direction is regarded as a downward direction. The −Z-direction may coincide with the gravity direction, or may be different from the gravity direction. The Z-direction is an example of the first direction, the Y-direction is an example of the second direction, and the X-direction is an example of the third direction.

The substrate 1 includes a plurality of diffusion layers 1a. The diffusion layers 1a are formed near the surface of the substrate 1, in the substrate 1. For example, the diffusion layers 1a function as source regions and drain regions of the transistors 2. As described later, the diffusion layers 1a function as an anode layer and a cathode layer of a diode constituting an ESD protection circuit.

The transistors 2 include gate insulators 2a and gate electrodes 2b that are formed on the substrate 1 in order. For example, the gate insulators 2a are silicon oxide films. For example, the gate electrodes 2b are polysilicon layers. For example, the transistors 2 control the operation of a memory cell array of the three-dimensional memory.

The inter layer dielectric 3 is formed on the substrate 1, and covers the transistors 2. For example, the inter layer dielectric 3 includes a silicon oxide film or another insulator. The multi-layer interconnect portion 4, the source layer 5, the electrode layers 6, the columnar portions 7, the multi-layer interconnect portion 8 and the insulator 9 are formed in the inter layer dielectric 3. The multi-layer interconnect portion 4 includes a plurality of interconnect layers and a plurality of plugs electrically connected with the interconnect layers. The multi-layer interconnect layer 4 in the present embodiment includes an interconnect layer including a plurality of interconnects 21, an interconnect layer including a plurality of interconnects 22, and an interconnect layer including a plurality of interconnects 23 above the substrate 1, in order. Furthermore, the multi-layer interconnect layer 4 in the present embodiment includes a plurality of plugs 11 electrically connecting the substrate 1 or the transistors 2 and the interconnects 21, a plurality of plugs 12 electrically connecting the interconnects 21 and the interconnects 22, and a plurality of plugs 13 electrically connecting the interconnects 22 and the interconnects 23. The plugs 11 to 13 are contact plugs or via plugs. The interconnects 21, 22 and 23 are examples of third and fourth interconnects and a lower interconnect.

The source layer 5 is formed above the multi-layer interconnect portion 4. For example, the source layer 5 includes at least one of a semiconductor layer such as a polysilicon layer and a metal layer such as a tungsten layer.

The source layer 5 functions as a source line. The source layer 5 is an example of a sixth interconnect.

The electrode layers 6 are formed above the source layer 5, and are separated from each other in the Z-direction. The electrode layers 6 in the present embodiment include a source-side select line 6a, a plurality of word lines 6b and a drain-side select line 6c above the source layer 5, in order. For example, the electrode layers 6 include metal layers such as tungsten layers. The electrode layers 6 are separated from each other through insulators such as silicon oxide films. In FIG. 1, the insulators are illustrated as a part of the inter layer dielectric 3.

The columnar portions 7 are formed in the electrode layers 6 on the source layer 5. The columnar portions 7 include memory insulators 7a and channel semiconductor layers 7b that are formed in the electrode layers 6 in order. For example, the memory insulators 7a include block insulators (e.g., silicon oxide film), charge storage layers (e.g., silicon nitride film) and tunnel insulators (e.g., silicon oxide film) that are formed in the electrode layers 6 in order. For example, the channel semiconductor layers 7b are polysilicon layers. The channel semiconductor layers 7b are electrically connected with the source layer 5. The columnar portions 7 may further include core insulators (e.g., silicon oxide film) formed in the channel semiconductor layers 7b. The electrode layers 6 and the columnar portions 7 in the present embodiment constitute the memory cell array of the three-dimensional memory. Each memory cell in a columnar portion 7 includes a charge storage layer at a position where an electrode layer 6 crosses a channel semiconductor layer 7b.

The multi-layer interconnect portion 8 includes a plurality of interconnect layers and a plurality of plugs electrically connected with the interconnect layers. The multi-layer interconnect layer 8 in the present embodiment includes an interconnect layer including a plurality of interconnects 24, an interconnect layer including a plurality of interconnects 25, and an interconnect layer including a plurality of interconnects 26 above the electrode layers 6, in order. Furthermore, the multi-layer interconnect layer 8 in the present embodiment includes a plurality of plugs 14 electrically connecting the electrode layers 6 or interconnects 23 and the interconnects 24, a plurality of plugs 15 electrically connecting the columnar portions 7 (channel semiconductor layers 7b) or interconnects 24 and the interconnects 25, and a plug 16 electrically connecting the interconnect 25 and the interconnect 26. The plugs 14 to 16 are contact plugs or via plugs. For example, the interconnects 25 include bit lines that are electrically connected to the semiconductor layers 7b. The interconnects 26 are examples first and second interconnects and an upper interconnect. The interconnects 25 are an example of a fifth interconnect.

The insulator 9 is formed on side surfaces of the plugs 14 electrically connecting the interconnects 23 of the multi-layer interconnect portion 4 and the interconnects 24 of the multi-layer interconnect portion 8. As shown in FIG. 1, the plugs 14 are provided in the plurality of electrode layers 6 described above, and penetrate through the electrode layers 6. Each of the plugs 14 is an example of the first plug. Further, the insulator 9 is provided between the plugs 14 and the electrode layers 6, and electrically insulates the plugs 14 and the electrode layers 6. For example, the insulator 9 is a silicon oxide film.

Figure 2:
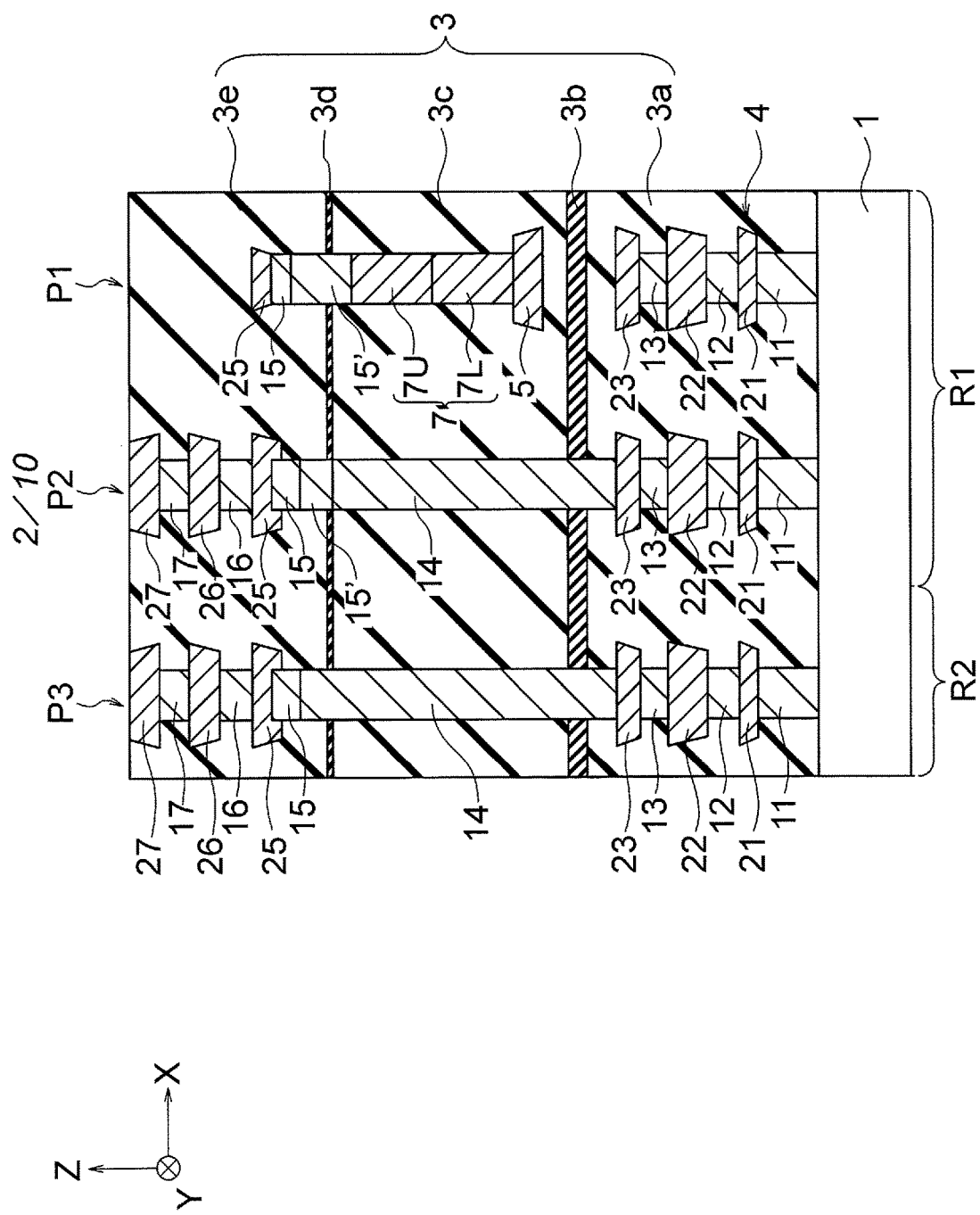
FIG. 2 is another sectional view showing the structure of the semiconductor device in the first embodiment.

FIG. 2 is another sectional view showing the structure of the semiconductor device in the first embodiment.

FIG. 2 shows the structure of the plugs 11 to 16 and the interconnects 21 to 26 in regions R1, R2 of the semiconductor device in the present embodiment. The region R1 contains the three-dimensional memory shown in FIG. 1. The region R2 contains the ESD protection circuit for the three-dimensional memory. Furthermore, FIG. 2 shows a plurality of plugs 15', a plurality of plugs 17, and a plurality of interconnects 27.

Reference character P1 shows the columnar portion 7 and the plugs 15', 15 and the interconnect 25 that are relevant to the columnar portion 7. Hereinafter, the structure shown by reference character P1 is referred to as the structure P1. As shown in FIG. 2, the columnar portion 7 is disposed in the region R1, and includes a lower columnar portion 7L on the source layer 5 and an upper columnar portion 7U on the lower columnar portion 7L. The structure P1 includes the plug 15', the plug 15 and the interconnect 25 on the upper columnar portion 7U, in order. The interconnect 25 functions as a bit line.

Reference character P2 shows the plug 14 electrically connecting the multi-layer interconnect portion 4 and the multi-layer interconnect portion 8, and the plugs 11, 12, 13, 15', 15, 16, 17 and the interconnects 21, 22, 23, 25, 26, 27 that are relevant to the plug 14. Hereinafter, the structure shown by reference character P2 is referred to as the structure P2. In the structure P2, the illustration of the interconnect 24 is omitted. As shown in FIG. 2, the structure P2 is disposed in the region R1, and includes the plug 11, the interconnect 21, the plug 12, the interconnect 22, the plug 13, the interconnect 23, the plug 14 (interconnect 24), the plug 15', the plug 15, the interconnect 25, the plug 16, the interconnect 26, the plug 17 and the interconnect 27 on the substrate 1, in order. As escribed above, the plug 14 in the structure P2 is an example of a first plug.

The constituent elements included in the structure P2 are formed in the same XZ-section in FIG. 2, but do not need to be formed in the same XZ-section. For example, the plug 17 of the structure P2 may be disposed just above the plug 11 of the structure P2, or may be disposed at a position deviated from a position just above the plug 11 of the structure P2.

Reference character P3 shows the plugs 11, 12, 13, 14, 15, 16, 17 and the interconnects 21, 22, 23, 25, 26, 27 that are relevant to the ESD protection circuit. Hereinafter, the structure shown by reference character P3 is referred to as the structure P3. In the structure P3, the illustration of the interconnect 24 is omitted. As shown in FIG. 2, the structure P3 is disposed in the region R2, and includes the plug 11, the interconnect 21, the plug 12, the interconnect 22, the plug 13, the interconnect 23, the plug 14 (interconnect 24), the plug 15, the interconnect 25, the plug 16, the interconnect 26, the plug 17 and the interconnect 27 on the substrate 1, in order. The plug 14 in the structure P3 is examples of second, third and fourth plugs.

The constituent elements included in the structure P3 are formed in the same XZ-section in FIG. 2, but do not need to be formed in the same XZ-section. For example, the plug 17 of the structure P3 may be disposed just above the plug 11 of the structure P3, or may be disposed at a position deviated from a position just above the plug 11 of the structure P3.

The Z-directional length of the plug 14 in the structure P3 is different from the Z-directional length of the plug 14 in the structure P2, by the length of the plug 15' in the structure P2. However, the plug 14 in the structure P2 and the plug 14 in the structure P3 are disposed (positioned) at the same level, that is, are disposed across the same XY-section. In FIG. 1 and FIG. 2, plugs disposed at the same level are denoted by the same reference characters. For example, in FIG. 1, the plug 14 in the electrode layers 6 (the plug 14 in the structure P2) and the plugs 14 on the electrode layers 6 are denoted by the same reference character "14". In the other words, the plug 14 in the electrode layers 6 (the plug 14 in the structure P2) is disposed in a lateral direction of the plugs 14 on the electrode layers 6. The same goes for the plug 14 in the structure P3.

The plug 14 in the structure P3 in the present embodiment is formed at the same stage as the plug 14 in the structure P2. Therefore, the Z-directional length of the plug 14 in the structure P3 is long similarly to the Z-directional length of the plug 14 in the structure P2. Consequently, in the ESD protection circuit in the present embodiment, there is a fear that the electric resistance of the plug 14 in the structure P3 is large. A coping method for this problem will be described later.

Furthermore, FIG. 2 shows insulators 3a, 3b, 3c, 3d, 3e that are formed on the substrate 1 in order and that are included in the inter layer dielectric 3. For example, the insulators 3a, 3c, 3e include silicon oxide films or other insulators. For example, the insulator 3b is a barrier SiN film (silicon nitride film), and is formed at a level close to the level of the lower end of the plug 14 in the structure P3. For example, the insulator 3d is an etch stopper SiN film, and is formed at a level close to the level of the upper end of the plug 14 in the structure P3.

Figure 3:
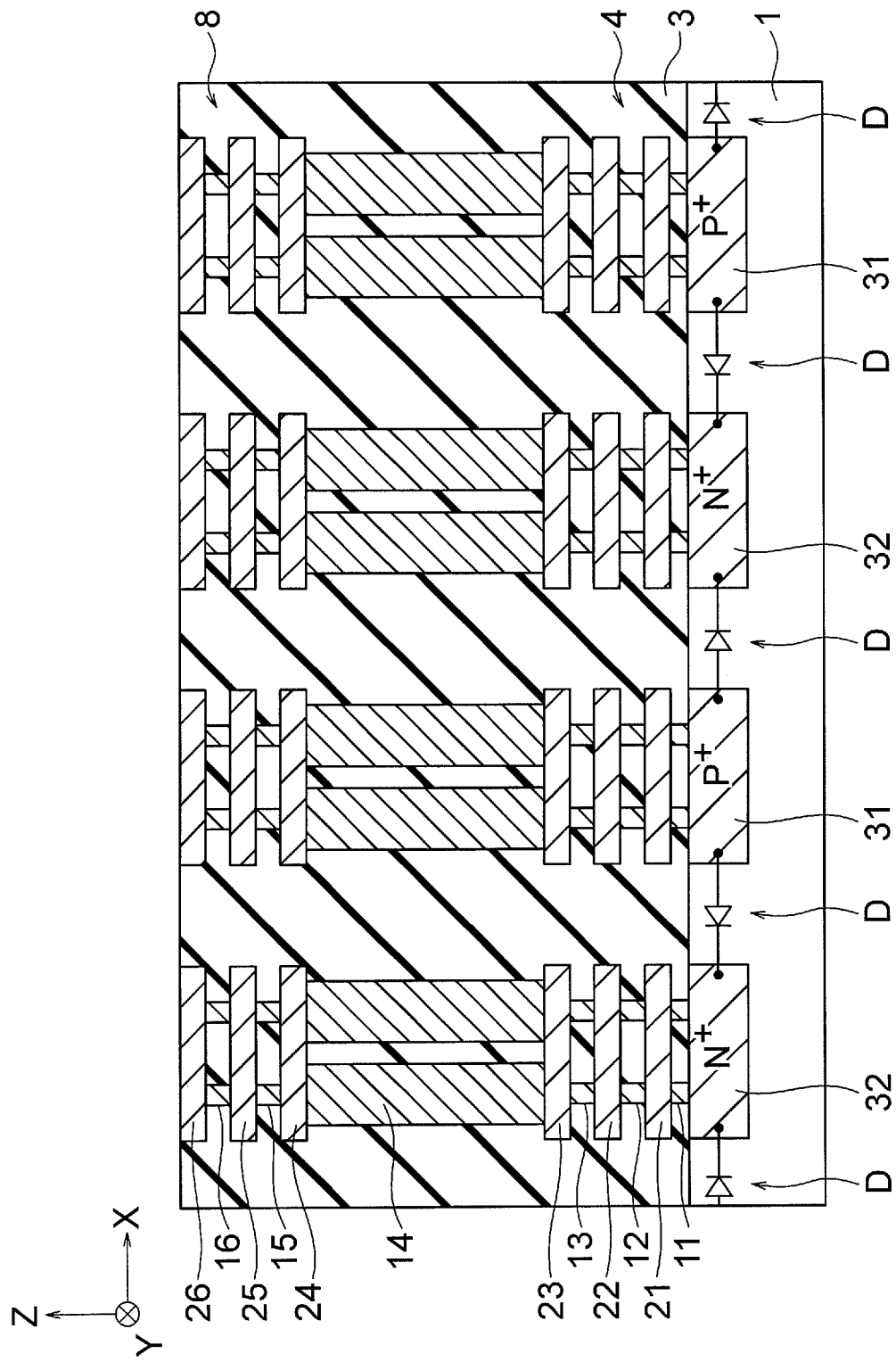
FIG. 3 is another sectional view showing the structure of the semiconductor device in the first embodiment.

FIG. 3 is another sectional view showing the structure of the semiconductor device in the first embodiment.

FIG. 3 shows the structure of the ESD protection circuit in the semiconductor device in the present embodiment. The semiconductor device in the present embodiment includes a plurality of anode layers 31 and one cathode layer 32, as the diffusion layers 1a for the ESD protection circuit. The anode layers 31 and the cathode layer 32 in the present embodiment have a shape shown in FIG. 5 described later. That is, the anode layers 31 have a rectangular plane shape, and the cathode layer 32 has a ladder-like plane shape (see FIG. 5). FIG. 3 shows two anode layers 31 of the plurality of anode layers 31 described above and two portions constituting the above one cathode layer 32. The semiconductor device in the present embodiment may include a plurality of anode layers 31 and a plurality of cathode layers 32.

The anode layers 31 and the cathode layer 32 are formed in the substrate 1, near the surface of the substrate 1. For example, the anode layers 31 are a $P^+$ impurity diffusion layers.

For example, the cathode layer 32 is an $N^+$ impurity diffusion layer. The anode layers 31 and the cathode layer 32 constitute diodes D for the ESD protection circuit. One of the anode layers 31 and the cathode layer 32 is examples of a first diffusion layer, a first diffusion region and a second diffusion region, and the other of the anode layers 31 and the cathode layer 32 is an example of a second diffusion layer.

Furthermore, as shown in FIG. 3, the semiconductor device in the present embodiment includes the plug 11, the interconnect 21, the plug 12, the interconnect 22, the plug 13, the interconnect 23, the plug 14, the interconnect 24, the plug 15, the interconnect 25, the plug 16 and the interconnect 26 that are formed on the anode layers 31 and the cathode layer 32 in order. Consequently, each of the plugs 11 to 16 and each of the interconnects 21 to 26 are electrically connected with the anode layer 31 or the cathode layer 32. The structure P3 shown in FIG. 2 is included in the plugs 11 to 16 and the interconnects 21 to 26 shown in FIG. 3. As described above, the plug 14 shown in FIG. 3 is an example of the second plug.

By this ESD protection circuit, the present embodiment makes it possible to protect the three-dimensional memory that is a protection target circuit, from static electricity. The ESD protection circuit is an example of the protection circuit.

Figure 4:
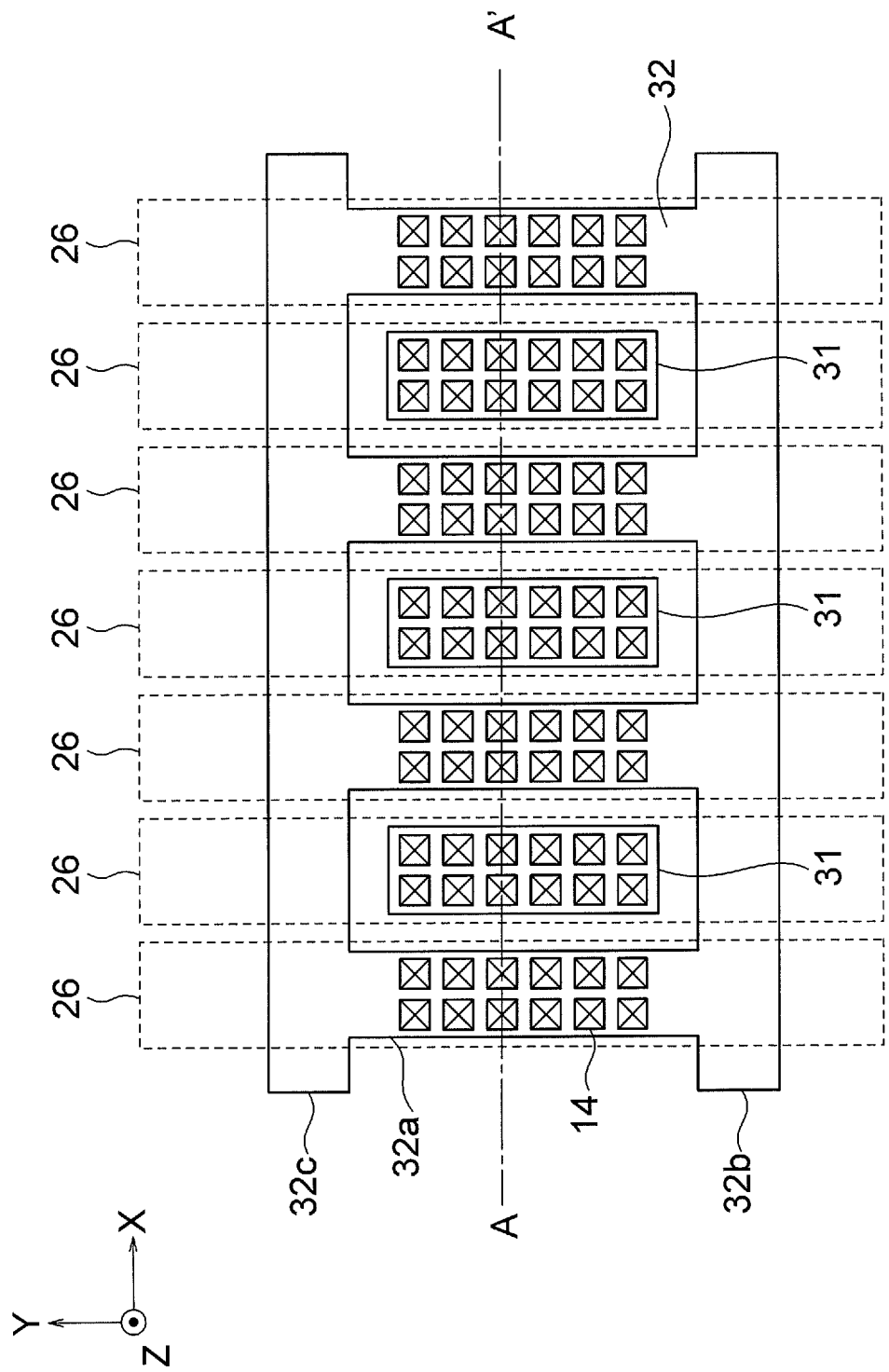
FIG. 4 is a plan view showing a structure of a semiconductor device in a comparative example of the first embodiment.
Figure 5:
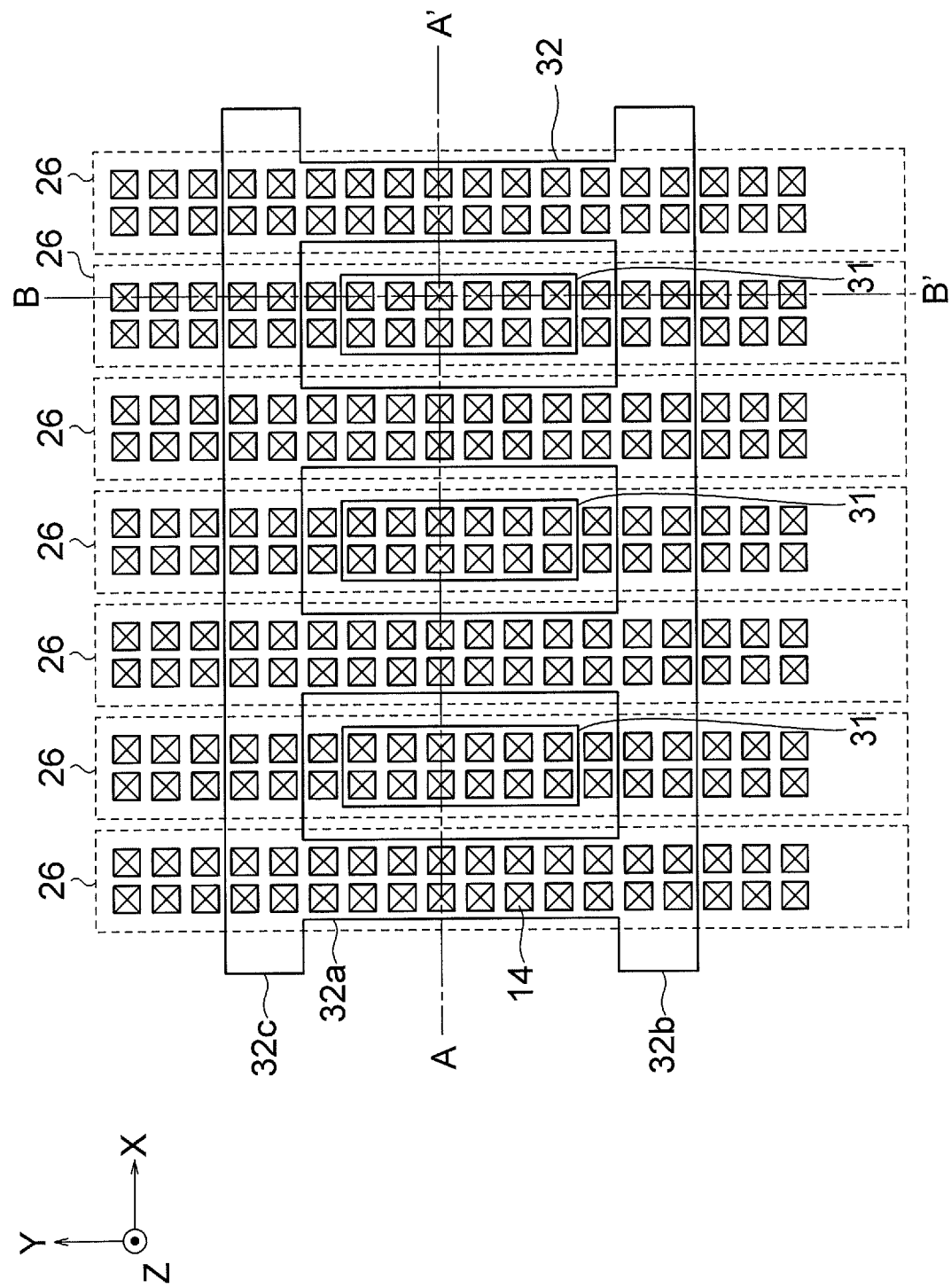
FIG. 5 is a plan view showing the structure of the semiconductor device in the first embodiment.

Next, the semiconductor device in the present embodiment and a semiconductor device in a comparative example will be compared with reference to FIG. 4 and FIG. 5.

The structures shown in FIG. 1 to FIG. 3 are common between the semiconductor device in the comparative example shown in FIG. 4 and the semiconductor device in the present embodiment shown in FIG. 5.

FIG. 4 is a plan view showing a structure of the semiconductor device in the comparative example of the first embodiment.

FIG. 4 shows the layout of the plugs 14, the interconnects 26, the anode layers 31 and the cathode layer 32 in the comparative example. In FIG. 4, the shapes of the interconnects 26 are shown by broken lines, and the shapes of the anode layers 31 and the cathode layer 32 are shown by solid lines. FIG. 3 shows an XZ-section taken along line A-A' shown in FIG. 4.

As described above, the semiconductor device in the comparative example includes the plurality of anode layers 31 and one cathode layer 32. The anode layers 31 extend in the Y-direction, and are adjacent to each other in the X-direction across the cathode layer 32. On the other hand, the cathode layer 32 includes a plurality of portions 32a extending in the Y-direction, one portion 32b extending in the X-direction, and one portion 32c extending in the X-direction. The plurality of portions 32a described above are adjacent to each other in the X-direction across the anode layers 31. The portion 32b is connected with the −Y-directional end portions of the respective portions 32a, and the portion 32c is connected with the +Y-directional end portions of the respective portions 32a. The portion 32a is examples of first and fourth portions. The portions 32b and 32c are examples of second and third portions.

The anode layers 31 in the comparative example have a rectangular plane shape extending in the Y-direction. On the other hand, the cathode layer 32 in the comparative example has a ladder-like plane shape extending in the X-direction, and has a plurality of opening portions. The anode layers 31 are formed in the cathode layer 32 so as to be contained in the opening portions. Consequently, the anode layers 31 are surrounded by the cathode layer 32 in planar view. In the comparative example, each anode layer 31 is electrically connected with an I/O (input/output) pin of the semiconductor device, and the cathode layer 32 is electrically connected with a VCC power source line of the semiconductor device.

The interconnects 26 in the comparative example extend in the Y-direction, and are adjacent to each other in the X-direction. As described above, the interconnects 26 are provided in an identical interconnect layer, and are electrically connected with the plugs 14. In the comparative example, each interconnect 26 is disposed above one anode layer 31, or is disposed above one portion 32a.

The plugs 14 in the comparative example are disposed just above the anode layers 31 and the portions 32a. That is, the plugs 14 in the comparative example are disposed at positions that overlap with the anode layer 31 or the portion 32a in the Z-direction. Consequently, the plugs 14 shown in FIG. 4 are shown in the solid lines showing the shapes of the anode layers 31 and between the solid lines showing the shapes of the portions 32a. Meanwhile, the plugs 14 in the comparative example are not disposed just above the portion 32b and the portion 32c. That is, the plugs 14 in the comparative example are not disposed at positions that overlap with the portions 32b and the portion 32c in the Z-direction. Furthermore, the plugs 14 in the comparative example are not disposed at positions that overlap with neither the anode layers 31 nor the cathode layer 32 in the Z-direction.

FIG. 5 is a plan view showing the structure of the semiconductor device in the first embodiment.

Similarly to FIG. 4, FIG. 5 shows the layout of the plugs 14, the interconnects 26, the anode layers 31 and the cathode layer 32 in the present embodiment. The layout of the interconnects 26, the anode layers 31 and the cathode layer 32 in the present embodiment are the same as the layout of the interconnects 26, the anode layers 31 and the cathode layer 32 in the comparative example. Also in the present embodiment, each anode layer 31 is electrically connected with the I/O pin of the semiconductor device, and the cathode layer 32 is electrically connected with the VCC power source line of the semiconductor device.

The plugs 14 in the present embodiment are disposed not only just above the anode layers 31 and the portions 32a but also just above the portion 32b and the portion 32c. That is, the plugs 14 in the present embodiment are disposed not only at positions that overlap with the anode layers 31 and the portion 32a in the Z-direction but also at positions that overlap with the portion 32b and the portion 32c in the Z-direction. Furthermore, the plugs 14 in the present embodiment are disposed also at positions that overlap with neither the anode layers 31 nor the cathode layer 32 in the Z-direction. For example, the plugs 14 in the present embodiment are disposed also in the −Y-direction of the portion 32b and in the +Y-direction of the portion 32c, in the planar disposition shown in FIG. 5.

In the semiconductor device in the present embodiment, a layer shown by reference character 31 may be used as the "cathode layer", and a layer shown by reference character 32 may be used as the "anode layer".

Here, the semiconductor device in the present embodiment shown in FIG. 5 and the semiconductor device in the comparative example shown in FIG. 4 are specifically compared.

In the three-dimensional memory shown in FIG. 1, when the number of the word lines 6b is increased for increasing the memory capacity, the Z-directional length of the plug 14 (the plug 14 in the structure P2) in the electrode layers 6 increases.

As a result, the Z-directional length of the plug 14 (the plug 14 in the structure P3) of the ESD protection circuit also increases. Thereby, the total length of the contact plug or via plug from a bonding pad of the semiconductor device to the anode layers 31 and cathode layer 32 of the ESD protection circuit, that is, contact length increases.

The increase in the contact length causes the increase in the contact resistance of a surge path, the decrease in contact fusion-resistant voltage, and the increase in parasitic capacity between the adjacent plugs. The plugs are used as main paths of electrostatic discharge (ESD) paths, and therefore, the number of the plugs for the ESD paths tends to increase with the increase in the memory capacity. Meanwhile, even when the memory capacity increases, the areas of the anode layers 31 and the cathode layer 32 do not increase in many cases. In recent years, the speed-up of the interface of the three-dimensional memory has advanced, and also from that standpoint, the reduction in I/O pin capacity by the reduction in the parasitic capacity has been demanded.

In the comparative example (FIG. 4), the plugs 14 are disposed just above the anode layers 31 and the portions 32a, for leading a surge to the diodes D shown in FIG. 3. However, there is a limit to the areas of the anode layers 31 and the portions 32a, and therefore, when the number of plugs 14 increases, a sufficient number of plugs 14 cannot be disposed just above the anode layers 31 and the portions 32a. Further, for reducing the I/O pin capacity, it is necessary to reduce the number of diodes D, and therefore, also for this reason, the areas of the anode layers 31 and the portions 32a cannot be enlarged. Consequently, in the comparative example, a sufficient number of plugs 14 cannot be disposed, and the resistances of the plugs 14 are high. Since the Z-directional lengths of the plugs 14 are long, the resistances of the plugs 14 greatly influence the contact resistance.

Hence, the plugs 14 in the present embodiment are disposed not only just above the anode layers 31 and the portion 32a but also just above the portions 32b and the portions 32c. Further, the plugs 14 in the present embodiment are disposed also at positions that overlap with neither the anode layers 31 nor the cathode layer 32 in the Z-direction. This makes it possible to dispose a sufficient number of plugs 14, and it is possible to lower the resistances of the plugs 14. In the present embodiment, it is possible to dispose a sufficient number of plugs 14, without enlarging the areas of the anode layers 31 and the portions 32a. In this way, the present embodiment makes it possible to realize a suitable layout of the ESD protection circuit that allows reduction in the surge path resistance and the pin capacity, by using regions other than the regions just above the anode layers 31 and the portions 32a, as plug disposition regions.

The plugs 14 in the present embodiment may be disposed at only one of the positions that overlap with the portion 32b and the portion 32c in the Z-direction and the positions that overlap with neither the anode layers 31 nor the cathode layer in the Z-direction. Further, plugs 14 in the present embodiment may be disposed at only one of the position that overlaps with the portion 32b in the Z-direction and the position that overlaps with the portion 32c in the Z-direction. Further, the cathode layer 32 in the present embodiment may include both of the portion 32b and the portion 32c, or may include only one of the portion 32b and the portion 32c.

Furthermore, the ESD protection circuit shown in FIG. 3 does not need to lead the surge to all diodes D shown in FIG. 3, and may lead the surge to only some of the diodes D shown in FIG. 3. For example, for using the anode layer 31 on the right side shown in FIG. 3 and avoiding the use of the anode layer 31 on the left side shown in FIG. 3, the anode layer 31 on the left side may be configured not to be electrically connected with the surge path. In this case, the surge is not led to the diode D of the anode layer 31 on the left side. In the present embodiment, it is allowable to use only N/2 anode layers 31 of N anode layers 31 separated from each other in the X-direction, by using every other anode layer 31 (N is a positive integer).

Figure 6:
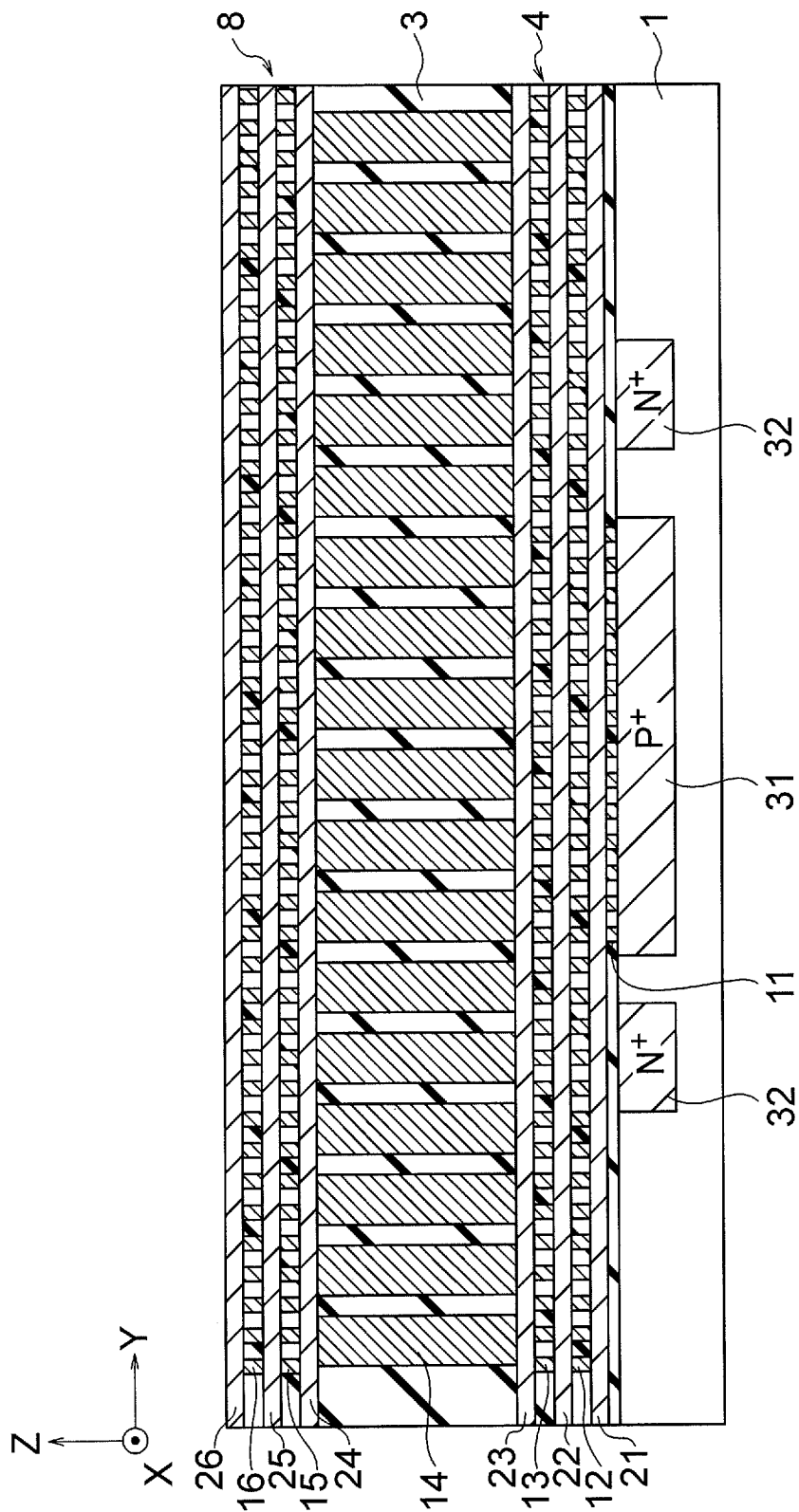
FIG. 6 is another sectional view showing the structure of the semiconductor device in the first embodiment.

FIG. 6 is another sectional view showing the structure of the semiconductor device in the first embodiment.

FIG. 6 is a YZ-section taken along line B-B' shown in FIG. 5. FIG. 6 shows the plugs 11 to 16, the interconnects 21 to 26, the anode layer 31, the cathode layer 32, and others. In the present embodiment, as shown in FIG. 6, not only the plugs 14 but also the plugs 11, 12, 13 15, 16 are disposed in a wide range. This makes it possible to considerably reduce the contact resistance of the plugs 11 to 16.

As described above, the plugs 14 in the present embodiment are disposed not only just above the anode layers 31 and the portions 32a but also just above the portion 32b and the portion 32c. Furthermore, the plugs 14 in the present embodiment are disposed also at the positions that overlap with neither the anode layers 31 nor the cathode layer 32 in the Z-direction. Consequently, the present embodiment makes it possible to provide the ESD protection circuit having a suitable layout, in the semiconductor device.

Second Embodiment

Figure 7:
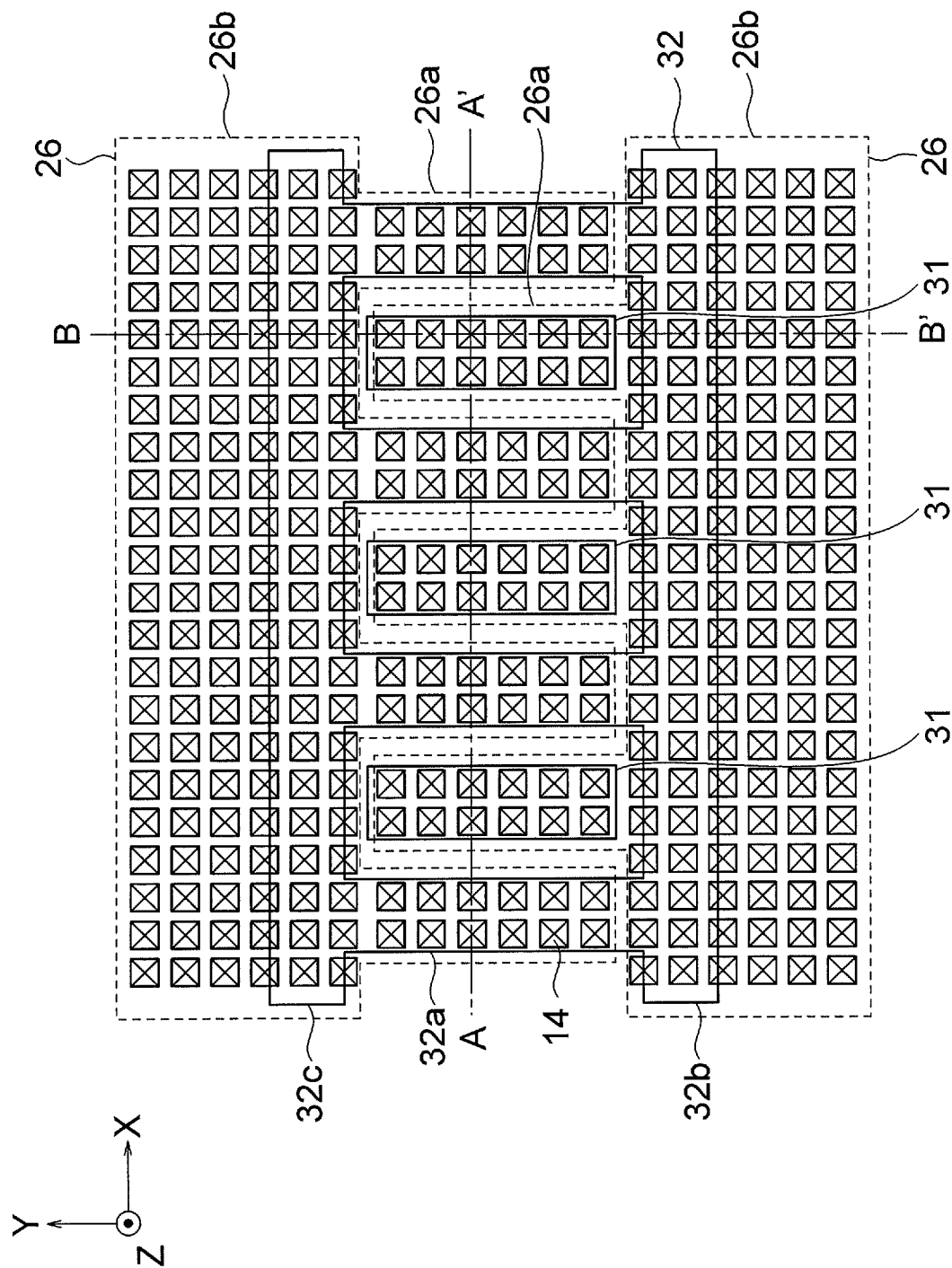
FIG. 7 is a plan view showing a structure of a semiconductor device in a second embodiment.

FIG. 7 is a plan view showing a structure of a semiconductor device in a second embodiment.

Similarly to FIG. 5, FIG. 7 shows the layout of the plugs 14, the interconnects 26, the anode layers 31 and the cathode layer 32 in the present embodiment. For the semiconductor device in the present embodiment, different points from the semiconductor device in the first embodiment are mainly described, and descriptions of common points with the semiconductor device in the first embodiment are omitted when appropriate.

FIG. 7 shows two interconnects 26.

One interconnect 26 includes a plurality of regions 26a extending in the Y-direction above the anode layers 31 and a region 26b extending in the X-direction above the portion 32b and others. In this interconnect 26, the plurality of regions 26a described above are adjacent to each other in the X-direction, and the region 26b is connected with the −Y-directional end portions of the respective regions 26a. This interconnect 26 is an example of the first interconnect, and the region 26a and region 26b of the interconnect 26 are examples of the first and second regions, respectively.

The other interconnect 26 includes a plurality of regions 26a extending in the Y-direction above the portions 32a and the region 26b extending in the X-direction above the portions 32c and others. In this interconnect 26, the plurality of regions 26a described above are adjacent to each other in the X-direction, and the region 26b is connected with the +Y-directional end portions of the respective regions 26a. This interconnect 26 is an example of the second interconnect, and the region 26a and the region 26b of the interconnect 26 are examples of the third and fourth regions, respectively.

Each of the interconnects 26 has a comb-shaped plane shape extending in the X-direction. The region 26b of the one interconnect 26 and the region 26b of the other interconnect 26 are disposed on opposite sides with respect to the regions 26a of the interconnects 26. That is, the region 26b of the one interconnect 26 and the region 26b of the other interconnect 26 are disposed in the −Y-direction and +Y-direction of the regions 26a of the interconnects 26.

In the present embodiment, it is easy to widely set the areas of the regions 26b of the interconnects 26. This makes it possible to dispose many plugs 14 electrically connected with the regions 26b, below the regions 26b, and makes it possible to further reduce the surge path resistance and the pin capacity.

Figure 8:
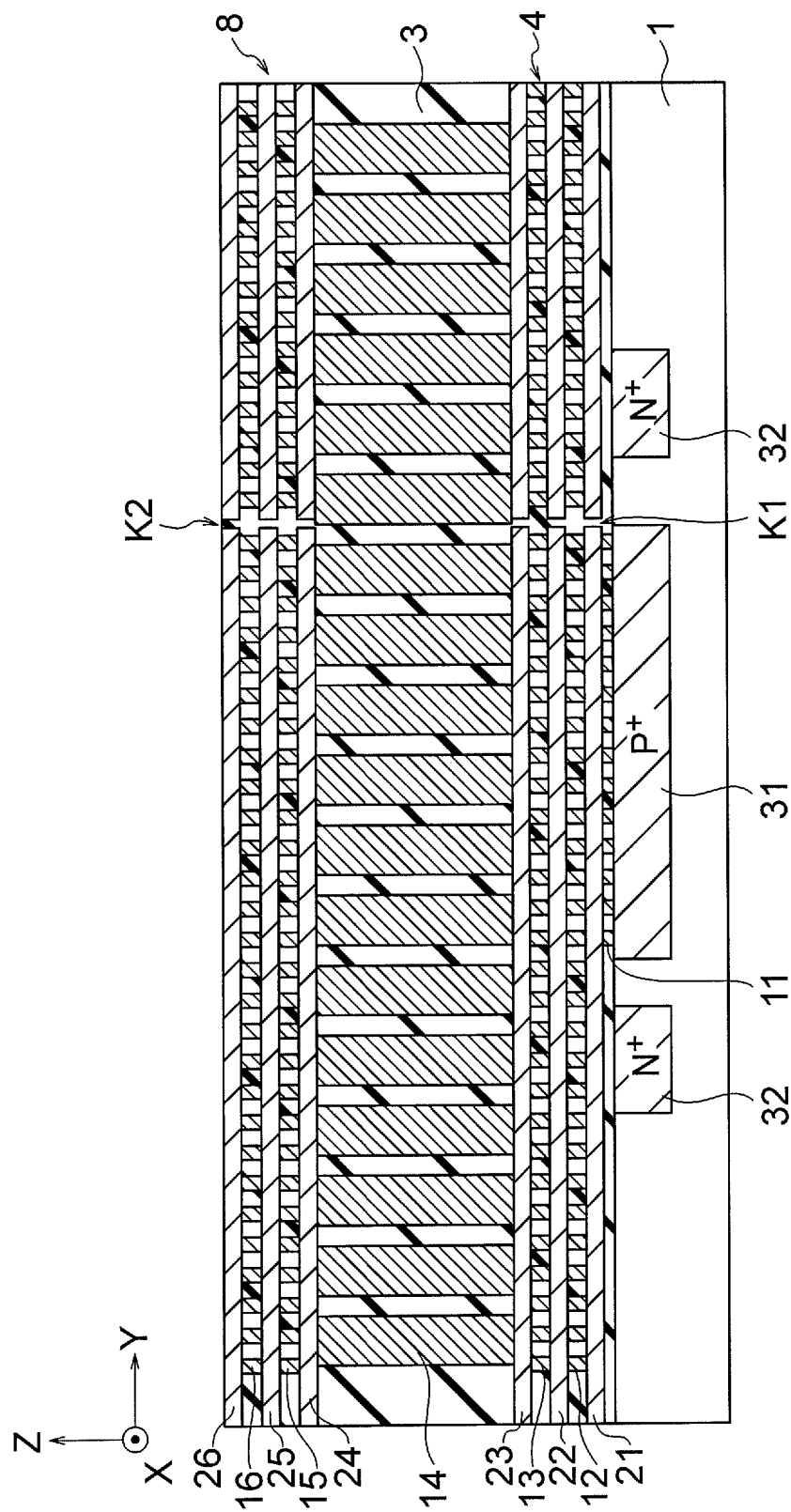
FIG. 8 is a sectional view showing the structure of the semiconductor device in the second embodiment.

FIG. 8 is a sectional view showing the structure of the semiconductor device in the second embodiment.

FIG. 8 shows a YZ-section taken along line B-B' shown in FIG. 7. FIG. 8 shows the plugs 11 to 16, the interconnects 21 to 26, the anode layer 31, the cathode layer 32, and others. In the present embodiment, as shown in FIG. 8, not only the plugs 14 but also the plugs 11, 12, 13, 15, 16 are disposed in a wide range. This makes it possible to considerably reduce the contact resistance of the plugs 11 to 16. Reference characters K1, K2 show breaks of the interconnects 21 to 26. In the present embodiment, it is possible to use one interconnects 21 to 26 for the anode layers 31, and to use the other interconnects 21 to 26 for the cathode layer 32.

In FIG. 8, the breaks of the interconnects 21 to 26 are formed almost just above the +Y-directional end portion of the anode layer 31. Meanwhile, the breaks of the interconnects 21 to 25 may be formed almost just above the +Y-directional end portion of the anode layer 31, and the break of the interconnect 26 may be formed almost just above the −Y-directional end portion of the anode layer 31. That is, the break of the interconnect 26 may be formed at a position deviated from a position just above the breaks of the interconnects 21 to 25. This makes it possible to reduce the interconnect resistance of the interconnect 26.

Similarly to the first embodiment, the present embodiment makes it possible to provide the ESD protection circuit having a suitable layout, in the semiconductor device.

Third Embodiment

Figure 9:
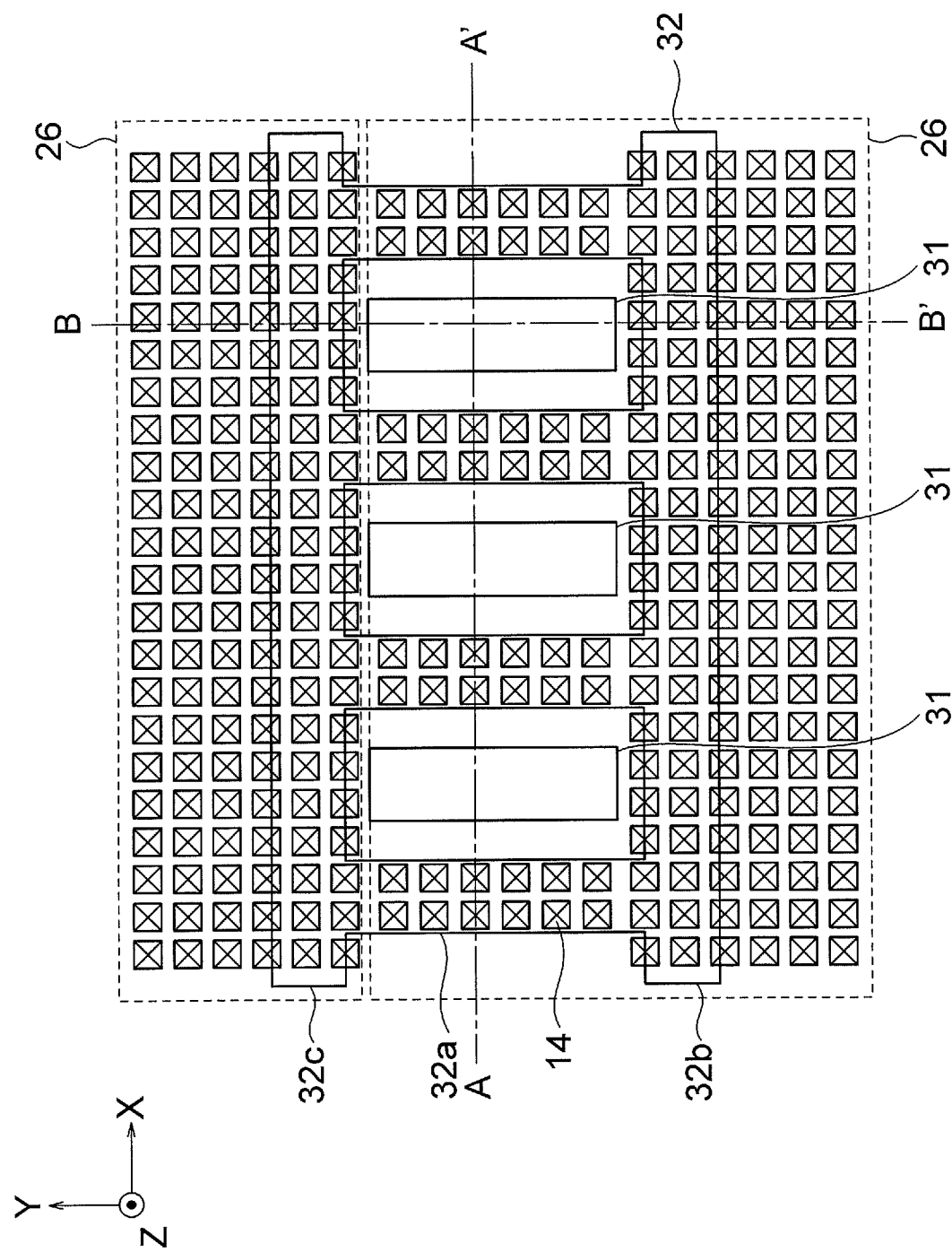
FIG. 9 is a plan view showing a structure of a semiconductor device in a third embodiment.

FIG. 9 is a plan view showing a structure of a semiconductor device in a third embodiment.

Similarly to FIG. 5 and FIG. 7, FIG. 9 shows the layout of the plugs 14, the interconnects 26, the anode layers 31 and the cathode layer 32 in the present embodiment. For the semiconductor device in the present embodiment, different points from the semiconductor device in the first and second embodiments are mainly described, and descriptions of common points with the semiconductor devices in the first and second embodiments are omitted when appropriate.

FIG. 9 shows two interconnects 26.

One interconnect 26 is provided in the Z-direction of the anode layers 31, the portions 32a and the portion 32b, and has a rectangular plane shape. This interconnect 26 is an example of the first interconnect. The other interconnect 26 is provided in the Z-direction of the portion 32c, and has a rectangular plane shape. This interconnect 26 is an example of the second interconnect.

In the present embodiment, it is easy to widely set the areas of the interconnects 26. This makes it possible to dispose many plugs 14 electrically connected with the interconnects 26, below the interconnects 26, and makes it possible to further reduce the surge path resistance and the pin capacity.

The plugs 14 in the present embodiment are disposed just above the portions 32a, 32b, 32c of the cathode layer 32 and at positions that overlap with neither the anode layers 31 nor the cathode layer 32 in the Z-direction. However, the plugs 14 in the present embodiment are not disposed just above the anode layer 31. This makes it possible to reduce the parasitic capacity (I/O pin capacity) between the anode layers 31 and the cathode layer 32. Further, in the present embodiment, as described above, it is possible to dispose many plugs 14, and therefore, it is possible to sufficiently reduce the surge path resistance even when the plugs 14 are not disposed just above the anode layers 31.

Figure 10:
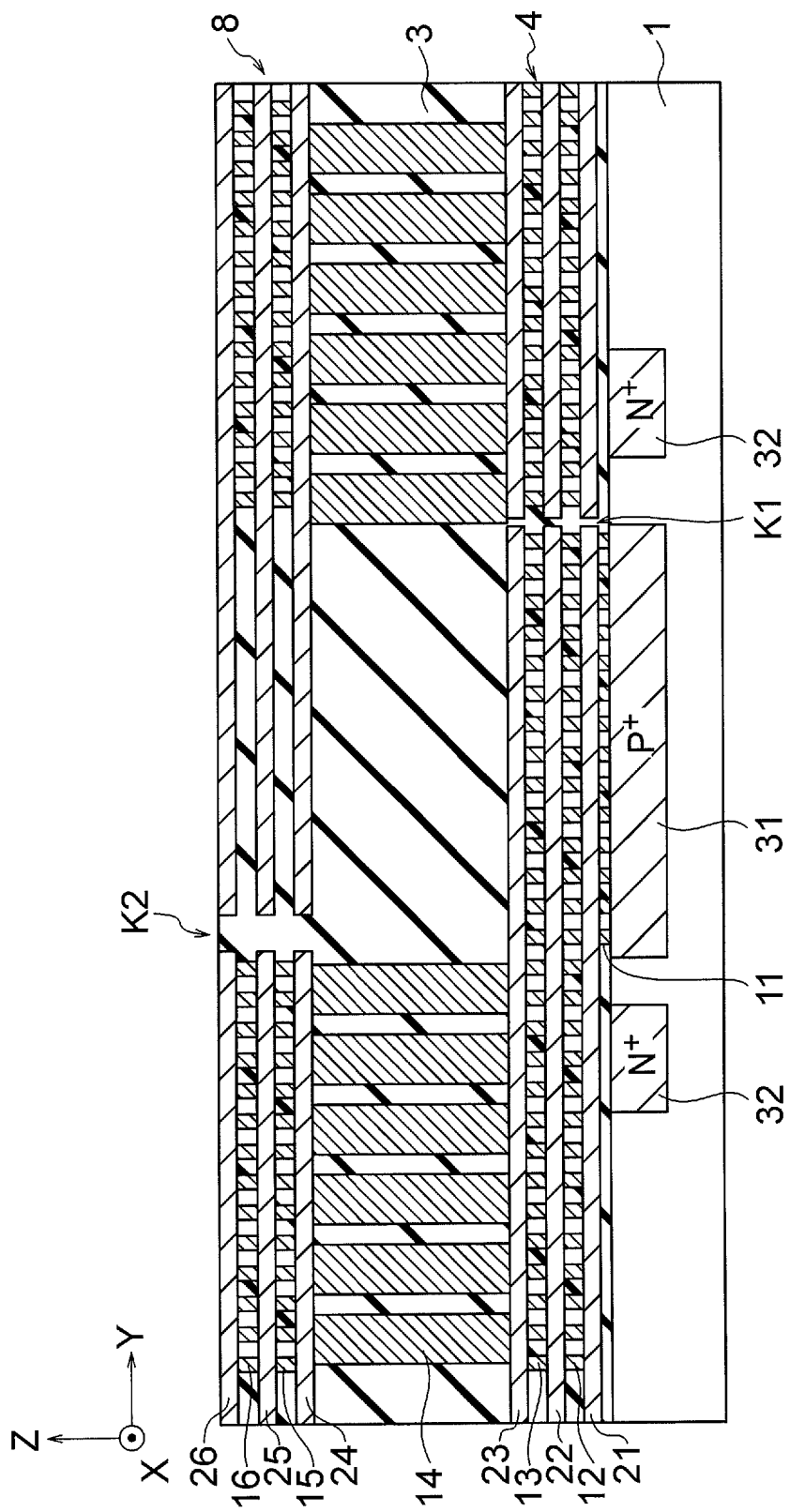
FIG. 10 is a sectional view showing the structure of the semiconductor device in the third embodiment.

FIG. 10 is a sectional view showing the structure of the semiconductor device in the third embodiment.

FIG. 10 shows a YZ-section taken along line B-B' shown in FIG. 9. FIG. 10 shows the plugs 11 to 16, the interconnects 21 to 26, the anode layers 31, the cathode layer 32, and others. In the present embodiment, as shown in FIG. 10, not only the plugs 14 but also the plugs 11, 12, 13, 15, 16 are disposed in a wide range. This makes it possible to considerably reduce the contact resistance of the plugs 11 to 16. Reference characters K1, K2 show the breaks of the interconnects 21 to 26. In the present embodiment, it is possible to use one interconnects 21 to 26 for the anode layers 31, and to use the other interconnects 21 to 26 for the cathode layer 32. In FIG. 10, the interconnects 24 to 26 for the cathode layer 32 are disposed just above the anode layer 31, and this makes it possible to reduce power source line resistance.

Similarly to the first and second embodiments, the present embodiment makes it possible to provide the ESD protection circuit having a suitable layout, in the semiconductor device.

Although the semiconductor device in each embodiment is a semiconductor storage device, it may be a device other than the semiconductor storage device. For example, the semiconductor device in each embodiment may be an SoC (System on Chip) device, a microcomputer chip, a wireless chip or the like.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

The invention claimed is:

1. A semiconductor device comprising:
a substrate in a first level;
a source line in a second level above the first level in a first direction perpendicular to a surface of the substrate;
a plurality of word lines provided in a third level above the second level in the first direction, the plurality of word lines being separated from each other in the first direction;
a first plug penetrating the plurality of word lines in the third level and electrically connected to the source line, a plurality of memory cells being provided between cross sections of the plurality of word lines and the first plug;
first and second diffusion layers provided in the substrate in the first level separately, one of the first and second diffusion layers functioning as an anode layer of an ESD (electrostatic discharge) protection circuit, the other of the first and second diffusion layers functioning as a cathode layer of the ESD protection circuit;
a second plug provided in the second level and the third level at a position that overlaps with the first diffusion layer in the first direction, the second plug being electrically connected with the first diffusion layer;
a third plug provided in the second level and the third level at a position that does not overlap with the first diffusion layer and the second diffusion layer in the first direction, the third plug being electrically connected with the first diffusion layer;
a fourth plug provided in the second level and the third level at a position that overlaps with the second diffusion layer in the first direction, the fourth plug provided between the second plug and the third plug in a second direction intersecting the first direction;
a plurality of interconnects provided in a fourth level between the first level and the second level, the plurality of interconnects electrically connected to the third plug and the first diffusion layer that is electrically connected to the second plug;
a first upper interconnect provided above the third level in the first direction, and electrically connected with the second plug and the third plug; and
a second upper interconnect provided above the third level in the first direction, electrically connected with the fourth plug, and not electrically connected with the first upper interconnect,
wherein the first plug, the second plug, the third plug, and the fourth plug are provided in the third level.

2. The device of claim 1, wherein
the first, second and third plugs extend in the first direction, and
the third plug is provided at a position that overlaps with the second diffusion layer in the first direction.

3. The device of claim 1, wherein
the first, second and third plugs extend in the first direction, and
the third plug is provided at a position that overlaps with neither the first nor second diffusion layer in the first direction.

4. The device of claim 1, wherein the first diffusion layer is surrounded by the second diffusion layer in a plane orthogonal to the first direction.

5. The device of claim 4, wherein
the first diffusion layer includes a first diffusion region and a second diffusion region, and
the first diffusion region and the second diffusion region are surrounded by the second diffusion layer in the plane orthogonal to the first direction.

6. The device of claim 5, wherein the first diffusion region and the second diffusion region extend in the second direction parallel to the surface of the substrate, and are separated from each other in a third direction that is parallel to the surface of the substrate and different from the second direction, each of the first diffusion region and the second diffusion region being surrounded by the second diffusion layer.

7. The device of claim 1, wherein
the first diffusion layer extends in the second direction parallel to the surface of the substrate; and
the second diffusion layer includes a first portion extending in the second direction, and includes at least one of a second portion connected with one end of the first portion and extending in a third direction that is parallel to the surface of the substrate and different from the second direction, and a third portion connected with another end of the first portion and extending in the third direction.

8. The device of claim 7, wherein the fourth plug is electrically connected with the second diffusion layer, wherein
the third plug extends in the first direction, and is provided at a position that overlaps with the first portion of the second diffusion layer in the first direction, and
the fourth plug extends in the first direction, and is provided at a position that overlaps with the second or third portion of the second diffusion layer in the first direction.

9. The device of claim 7, wherein the second diffusion layer further includes a fourth portion connected to the second and third portions and extending in the second direction.

10. The device of claim 9, wherein the first and fourth portions are provided to be separated from each other in the third direction.

11. The device of claim 7, further comprising:
a first interconnect provided above the second plug in the first direction and electrically connected with the second plug; and a second interconnect provided above the third plug in the first direction and electrically connected with the third plug.

12. The device of claim 11, wherein the first and second interconnects extend in the second direction, and are provided to be separated from each other in the third direction.

13. The device of claim 11, further comprising:
a third interconnect provided between the substrate and the second plug in the first direction, and electrically connected with the second plug; and
a fourth interconnect provided between the substrate and the third plug in the first direction, and electrically connected with the third plug;
wherein the plurality of word lines include a first word line provided above the third and fourth interconnects in the first direction,
wherein the plurality of word lines include a second word line provided between the first electrode layer and the first and second interconnects in the first direction, wherein the device further comprises:
a fifth interconnect provided between the word line layer and the first and second interconnects; and
a sixth interconnect provided between the first word line and the third and fourth interconnects, and
wherein the first plug includes:
a semiconductor layer penetrating through the first and second word lines, one end of the semiconductor layer being electrically connected with the fifth interconnect, the other end of the semiconductor layer being electrically connected with the sixth interconnect;
a first charge storage layer provided at a position where the first word line crosses the semiconductor layer; and
a second charge storage layer provided at a position where the second word line crosses the semiconductor layer.

* * * * *